(12) United States Patent
Lin et al.

(10) Patent No.: US 9,459,460 B2
(45) Date of Patent: Oct. 4, 2016

(54) OPTICAL IMAGE CAPTURING MODULE, ALIGNING METHOD, AND OBSERVING METHOD

(71) Applicant: METAL INDUSTRIES RESEARCH & DEVELOPMENT CENTRE, Kaohsiung (TW)

(72) Inventors: Shi-Wei Lin, Kaohsiung (TW); Chun-Ming Yang, Kaohsiung (TW); Chih-Chin Wen, Hsinchu (TW); Chorng-Tyan Lin, Kaohsiung (TW)

(73) Assignee: METAL INDUSTRIES RESEARCH & DEVELOPMENT CENTRE, Kaohsiung (TW)

( * ) Notice: Subject to any disclaimer, the term of this patent is extended or adjusted under 35 U.S.C. 154(b) by 97 days.

(21) Appl. No.: 14/455,240

(22) Filed: Aug. 8, 2014

(65) Prior Publication Data

US 2015/0049334 A1 Feb. 19, 2015

(30) Foreign Application Priority Data

Aug. 16, 2013 (TW) .............................. 102129545 A (51) Int. Cl.
| | |
|---|---|
| *G02B 27/10* | (2006.01) |
| *G03F 9/00* | (2006.01) |
| *H01L 21/68* | (2006.01) |
| *G02B 27/14* | (2006.01) |

(52) U.S. Cl.
CPC ......... *G02B 27/1013* (2013.01); *G02B 27/149* (2013.01); *G03F 9/00* (2013.01); *G03F 9/7007* (2013.01); *G03F 9/7046* (2013.01); *G03F 9/7088* (2013.01); *H01L 21/681* (2013.01)

(58) Field of Classification Search
CPC G02B 27/1013; G02B 27/149; G03B 17/17; G03B 2215/0582; G03F 9/00; G03F 9/7003; G03F 9/7007; G03F 9/7023; G03F 9/703; G03F 9/7034; G03F 9/7038; G03F 9/7046; G03F 9/7088; H01L 21/681
See application file for complete search history.

(56) References Cited

U.S. PATENT DOCUMENTS

| | | | | |
|---|---|---|---|---|
| 2,202,257 | A * | 5/1940 | Klaver .............. | G02B 27/1013 359/636 |
| 2,737,076 | A * | 3/1956 | Rock, Jr. .................. | G02B 5/04 156/99 |
| 2,809,570 | A * | 10/1957 | Dearing ................. | G02B 5/285 352/90 |
| 2,971,051 | A * | 2/1961 | Back ...................... | G02B 15/14 348/338 |
| 3,684,384 | A | 8/1972 | Hojo et al. | |
| 3,817,626 | A * | 6/1974 | Lietar ................ | G02B 21/0016 356/394 |
| 4,574,197 | A | 3/1986 | Kliever | |
| 4,608,494 | A * | 8/1986 | Kobayashi ............ | H01L 21/681 250/458.1 |

(Continued)

*Primary Examiner* — Gordon J Stock, Jr.
(74) *Attorney, Agent, or Firm* — WPAT, PC; Justin King; Jonathan Chiang (57) ABSTRACT

A method of aligning an upper substrate and a lower substrate is provided. The upper and lower substrates are oppositely arranged, and the aligning method includes the following steps: providing an optical image capturing module; emitting light rays to a third surface of a first prism; filtering the light rays, so that the light rays are divided into light rays at the first wavelength range and light rays at the second wavelength range, wherein the light rays at the first wavelength range irradiate a pattern on the upper substrate, and light rays at the second wavelength range irradiate a pattern on the lower substrate; reflecting a pattern image on the upper substrate to an image capturing apparatus; reflecting a pattern image on the lower substrate to the image capturing apparatus; and determining locations of the patterns of the upper and lower substrate that are on the image capturing apparatus.

14 Claims, 9 Drawing Sheets

(56) References Cited

U.S. PATENT DOCUMENTS

| | | | |
|---|---|---|---|
| 4,652,134 A * | 3/1987 | Pasch | G03F 9/70 356/401 |
| 5,519,535 A | 5/1996 | Mok | |
| 2002/0113976 A1* | 8/2002 | Kitabayashi | H04N 9/3105 356/614 |
| 2003/0133079 A1* | 7/2003 | Cobb | H04N 9/3105 353/31 |
| 2006/0262275 A1* | 11/2006 | Domroese | G03B 21/14 353/20 |
| 2013/0201458 A1* | 8/2013 | Kashiwagi | F21K 9/56 353/85 |
| 2014/0184791 A1* | 7/2014 | Lin | G03F 7/00 348/136 |

* cited by examiner

OPTICAL IMAGE CAPTURING MODULE, ALIGNING METHOD, AND OBSERVING METHOD

CROSS-REFERENCE TO RELATED APPLICATION

This application claims the benefit of Taiwan Patent Application No. 102129545, filed on Aug. 16, 2013, which is hereby incorporated by reference for all purposes as if fully set forth herein.

BACKGROUND

1. Technical Field

The present invention relates to an optical image capturing module, and in particular, to an optical image capturing module formed by four prisms, a first wavelength-selective-coating film, a second wavelength-selective coating film, and a beam splitting coating film group, and a method of aligning upper and lower substrates and a method of observing upper and lower substrates, which use an optical image capturing module of the present invention.

2. Related Art

U.S. Pat. No. 3,684,384 provides a composite optical prism module, which is formed with a truncated quadrangular, right prism with a 45° truncation and a rectangular prism united to the optical prism module to form a parallelepiped with a half-silvered mirror film at their interface and with a total reflecting mirror film at the vertical surface of the rectangular prism, so that the two components which are opposed in their mated positions can be superposed in the same coordinate space for image observation. However, in the disclosure of the prior art patent, two different right-angled prisms are used, so the path lengths of upper and lower ray paths are different, a manner of setting up a light source is limited, and the volume of the composite optical prism module is large.

U.S. Pat. No. 5,519,535 also discloses a composite optical prism, which is formed with two right-angled prisms to achieve the same optical effect with U.S. Pat. No. 3,684,384. In addition, a liquid crystal optical shutter is added to separately control presentation of images of objects at different sides. However, in the disclosure of the prior art patent, the liquid crystal optical shutter sacrifices the efficiency of the light intensity to some extent, and there are many control elements.

U.S. Pat. No. 4,574,197 discloses a dual field of view sensing device, in which a polygonal prism is mainly used to refract a ray through mechanical turning control, and then two parallel ray paths are reflected to the same sensor at the same time, so that a symmetrical ray path is achieved. Switching of ray paths is determined by turning locations of the polygonal prism, that is, two different ray path sources are reflected to the same plane space through a prism. However, the volume of the apparatus disclosed in the prior art patent is excessively large, a designed ray path is excessively long, and mechanical control is excessively complicated.

In the prior art, if two ray paths from different sources are mapped into the same plane space at the same time, main attention is focused on ray path design of a prism, which is mostly common in the foregoing prior art patents (U.S. Pat. No. 3,684,384 and U.S. Pat. No. 5,519,535). A composite right-angled prism reflects ray paths of an upper to-be-detected object and a lower to-be-detected object to the same image plane, which may cause the problem of inequality of path lengths of the opposite light rays from the upper to-be-detected object and the lower to-be-detected object. If image capturing is considered, the inequality of optical working distances may be caused, leading to that the upper to-be-detected object and the lower to-be-detected object is placed at asymmetrical distances, which may cause a complicated manufacturing process after alignment. Moreover, refraction paths are many in number, and sizes are too large for all current composite prism modules, so the composite prism modules do not conform to a process of the current optoelectronic industry.

Therefore, there is a need to provide an optical image capturing module having a symmetrical ray path, which can solve the foregoing problems.

SUMMARY

An objective of the present invention is to provide an optical image capturing module which has a symmetrical ray path length and is beneficial for reducing the whole size of an image capturing module, and methods of aligning and observing upper and lower substrates to which the optical image capturing module is applied.

To achieve the above-mentioned objective, the present invention provides an optical image capturing module, comprising: a first prism, a second prism, a third prism, a fourth prism, a first wavelength-selective medium, a second wavelength-selective medium, a beam splitting coating film group, a light source and an image capturing apparatus. The first prism has a first surface, a second surface, and a third surface, wherein section lengths of the first surface and the second surface are equal. The second prism has a first surface, a second surface, and a third surface, wherein section lengths of the first surface and the second surface are equal, and the second surface is adjacent to the first surface of the first prism. The third prism has a first surface, a second surface, and a third surface, wherein section lengths of the first surface and the second surface are equal, and the first surface is adjacent to the second surface of the first prism. The fourth prism has a first surface and a second surface of which section lengths are equal, wherein the first surface is adjacent to the second surface of the third prism, and the second surface of the fourth prism is adjacent to the first surface of the second prism. The first wavelength-selective medium is arranged on the third surface of the second prism, wherein the first wavelength-selective medium permits light rays at the first wavelength range greater than a cut-off wavelength to penetrate, and light rays at the second wavelength range less than the cut-off wavelength to reflect. The second wavelength-selective medium is arranged on the third surface of the third prism, wherein the second wavelength-selective medium permits light rays at the second wavelength range less than the cut-off wavelength to penetrate, and light rays at the first wavelength range greater than the cut-off wavelength to reflect. The beam splitting coating film group has a plurality of coating films, separately arranged between the first surface of the first prism and the second surface of the second prism, between the first surface of the second prism and the second surface of the fourth prism, between the first surface of the fourth prism and the second surface of the third prism, and between the first surface of the third prism and the second surface of the third prism. The light source emits light rays to the third surface of the first prism. The image capturing apparatus are oppositely arranged on the third surface of the first prism.

To achieve the above-mentioned objective, the present invention further provides a method of aligning an upper substrate and a lower substrate, the upper substrate and the lower substrate oppositely arranged, the method comprising the following steps of: providing an optical image capturing module, arranged between the upper substrate and the lower substrate, wherein the optical image capturing module is the above-mentioned optical image capturing module; emitting, by a light source, light rays to a third surface of a first prism; and irradiating, by light rays at the first wavelength range after leaving the optical image capturing module from a first wavelength-selective medium, a pattern of the upper substrate, and irradiating, by light rays at the second wavelength range after leaving the optical image capturing module from a second wavelength-selective medium, a pattern of the lower substrate; reflecting a pattern image of the upper substrate to image a first pattern on an image capturing apparatus, and reflecting a pattern image of the lower substrate to image a second pattern on the image capturing apparatus; determining locations of the first pattern and the second pattern; and moving the upper substrate or the lower substrate, so that the first pattern overlaps the second pattern.

To achieve the above-mentioned objective, the present invention further provides a method of observing a pattern on an upper substrate or a pattern on a lower substrate, the upper substrate and the lower substrate oppositely arranged, the method comprising the following steps of: providing an optical image capturing module, wherein the optical image capturing module is the above-mentioned optical image capturing module; emitting light rays at the first wavelength range to a third surface of a first prism, so that a part of light rays at the first wavelength range irradiate the upper substrate after being partially reflected by a beam splitting coating film group and partially penetrating the beam splitting coating film group; reflecting a pattern image of the upper substrate to an image capturing apparatus; observing the pattern image of the upper substrate; turning off the light rays at the first wavelength range; emitting light rays at the second wavelength range to the third surface of the first prism, so that a part of light rays at the second wavelength range irradiate the lower substrate after being partially reflected by the beam splitting coating film group and partially transmitting the beam splitting coating film group; reflecting a pattern image of the lower substrate to the image capturing apparatus; and observing the pattern image of the lower substrate.

The optical image capturing module of the present invention can provide a symmetrical light path length, which is beneficial for reducing the size of image capturing module, a symmetrical optical working distance can be reached, and contrast performance of images at two sides can be the same. Compared with a composite right-angled prism in the prior art which may cause inequality of reflection paths of rays of an upper to-be-detected object and a lower to-be-detected object, if image capturing is considered in the present invention, inequality of the optical working distances may not be caused, and therefore, the upper to-be-detected object and the lower to-be-detected object (an upper substrate and a lower substrates) of the present invention do not need to be placed at asymmetrical distances.

To make the foregoing objective and other objectives, features, and advantages of the present invention more obvious, description is made in the following in detail with reference to the accompanying drawings.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1A:
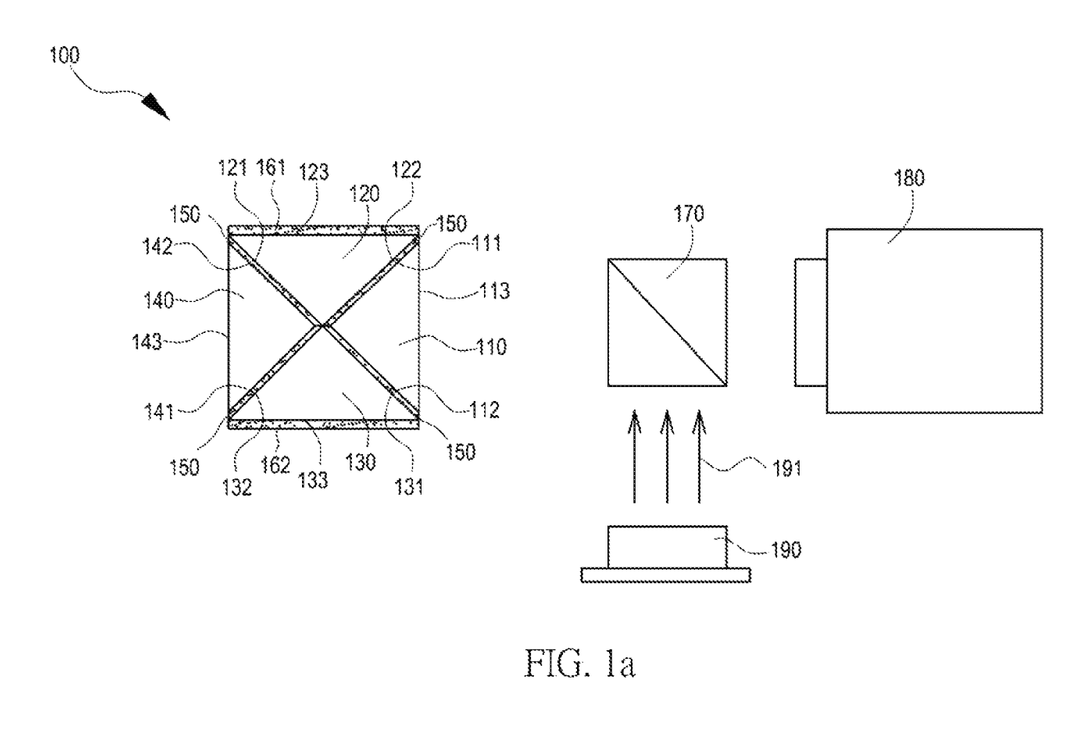
FIG. 1a is a schematic view of an optical image capturing module according to an embodiment of the present invention.

Referring to FIG. 1a, FIG. 1a is a schematic view of an optical image capturing module according to an embodiment of the present invention. The optical image capturing module 100 includes: an image capturing apparatus 180, a beam splitter 170, a light source 190, a first prism 110, a second prism 120, a third prism 130, a fourth prism 140, a first wavelength-selective medium, a second wavelength-selective medium, and a beam splitting coating film group 150. The first prism 110, the second prism 120, the third prism 130, and the fourth prism 140 respectively have first surfaces 111, 121, 131, 141, second surfaces 112, 122, 132, 142, and third surfaces 113, 123, 133, 143, and section lengths of the first surface and the second surface are equal, for example, section lengths of the first surface 111 and the second surface 112 of the first prism 110 are equal. It should be specifically noted that, a coating film or a filter can be adopted as the first wavelength-selective medium, and similarly, a coating film or a filter can be adopted as the second wavelength-selective medium. In the following description of this embodiment, the first wavelength-selective medium is indicated by using the first wavelength-selective coating film 161, and the second wavelength-selective medium is indicated by using the second wavelength-selective coating film 162.

Figure 1B:
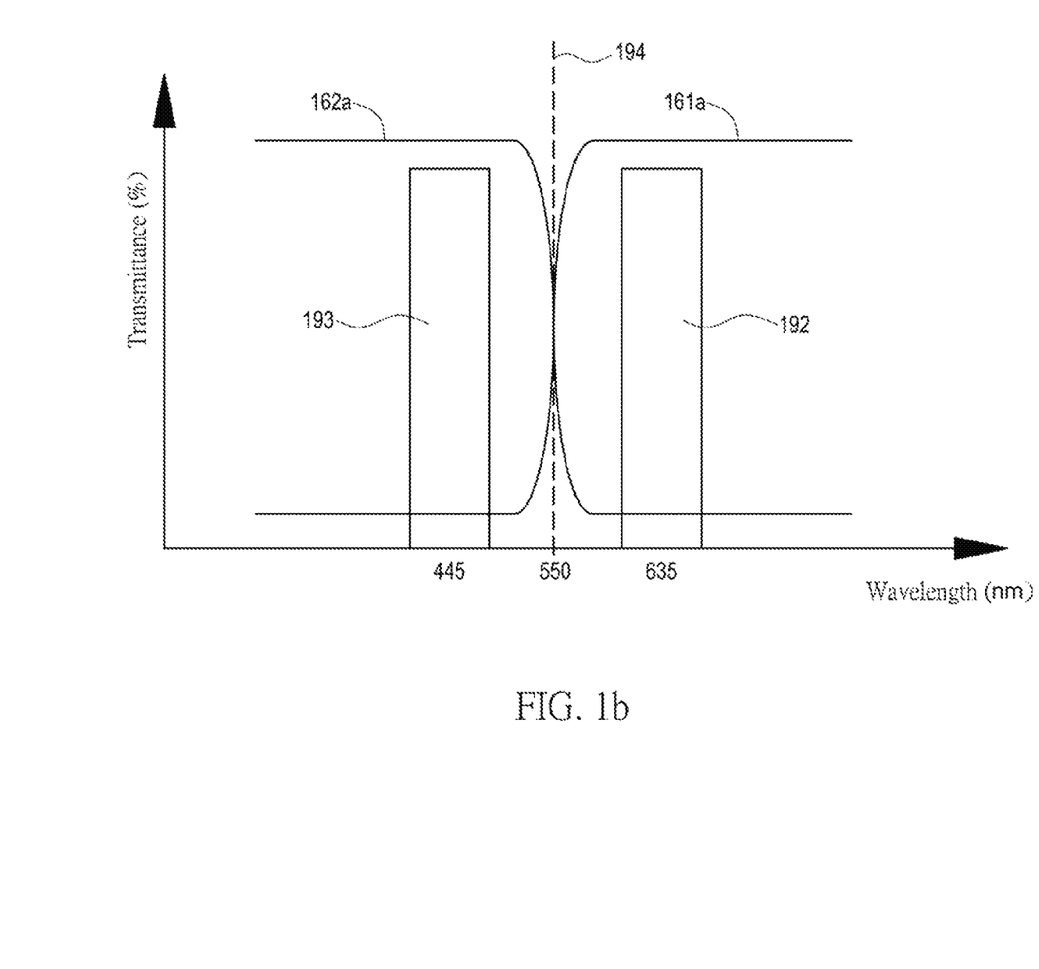
FIG. 1b is a state view of a first wavelength-selective medium and a second wavelength-selective medium at different transmittance wavelength ranges.

The first wavelength-selective coating film 161 is arranged on the third surface 123 of the second prism 120. The second wavelength-selective coating film 162 is arranged on the third surface 133 of the third prism 130. The first wavelength-selective coating film 161 and the second wavelength-selective coating film 162 permit light rays at a specific wavelength range to penetrate and light rays at other wavelength range to reflect. Referring to FIG. 1b and FIG. 1a together, FIG. 1b is a state view of a first wavelength-selective coating film 161 and a second wavelength-selective coating film 162 at different transmittance wavelength ranges. In FIG. 1b, the horizontal axis represents the optical wavelength, the vertical axis represents different transmittances of the first wavelength-selective coating film 161 and the second wavelength-selective coating film 162 at different optical wavelengths, a curve 161a indicates a transmittance curve of the first wavelength-selective coating film 161, and a curve 162a indicates a transmittance curve of the second wavelength-selective coating film 162; an intersection of the curve 161a and the curve 162a indicates a cut-off wavelength, and is a location shown by a dashed line 194 in FIG. 1b. In this embodiment, the designed cut-off wavelength is 550 nm, and the first wavelength-selective coating film 161 can permit light rays at the first wavelength range having first wavelengths (such as 635 nm) greater than the cut-off wavelength to penetrate, and light rays at the second wavelength range having second wavelengths (such as 445 nm) less than the cut-off wavelength to reflect. The second wavelength-selective coating film 162 permits light rays at the second wavelength range having second wavelengths (such as 445 nm) less than the cut-off wavelength to penetrate, and light ray at the first wavelength range having first wavelengths (such as 635 nm) greater than the cut-off wavelength to reflect. The first wavelength is greater than the cut-off wavelength, and the second wavelength is less than the cut-off wavelength.

The second surface 122 of the second prism 120 is adjacent to the first surface 111 of the first prism 110. The second surface 142 of the fourth prism 140 is adjacent to the first surface 121 of the second prism 120, the first surface 141 of the fourth prism 140 is adjacent to the second surface 132 of the third prism 130, and the first surface 131 of the third prism 130 is adjacent to the second surface 112 of the first prism 110.

The beam splitting coating film group 150 has a plurality of coating films, which permit a part of incident light rays to penetrate and a part of the incident light rays to reflect. The foregoing first, second, third, and fourth prisms 110, 120, 130, and 140 are combined, so that the plurality of coating films of the beam splitting coating film group 150 is separately arranged between the first surface 111 of the first prism 110 and the second surface 122 of the second prism 120, between the first surface 121 of the second prism 120 and the second surface 142 of the fourth prism 140, between the first surface 141 of the fourth prism 140 and the second surface 132 of the third prism 130, and between the first surface 131 of the third prism 130 and the second surface 112 of the first prism 110.

The image capturing apparatus 180 is opposite to the third surface 113 of the first prism 110. The beam splitter 170 is arranged between the first prism 110 and the image capturing apparatus 180, and is adjacent to the third surface 113 of the first prism 110.

The light source 190 is used for emitting light rays 191, the light rays 191 enter the beam splitter 170, and a direction in which the light rays 191 enter the beam splitter 170 is vertical to an image receiving direction of the image capturing apparatus 180. The light source 190 may have a switching function, and can emit light rays 192 at the first wavelength range and/or light rays 193 at the second wavelength range, or the light source 190 can also emit white light. In this implementation, the light rays 192 refers to a light ray at a single wavelength (such as 635 nm) greater than the cut-off wavelength being 550 nm, and the light rays 193 refers to a light ray at a single wavelength (such as 445 nm) less than the cut-off wavelength being 550 nm. However, the light ray 192 or the light ray 193 is not limited to a light ray at a single wavelength, or may also be a light ray in a range of continuous wavelengths. For example, the light rays 192 are a light ray at a wavelength range from 550 nm to 700 nm greater than the cut-off wavelength being 550 nm. The light rays 193 are a light ray at a wavelength range from 400 nm to 550 nm less than 550 nm.

Figure 1C:
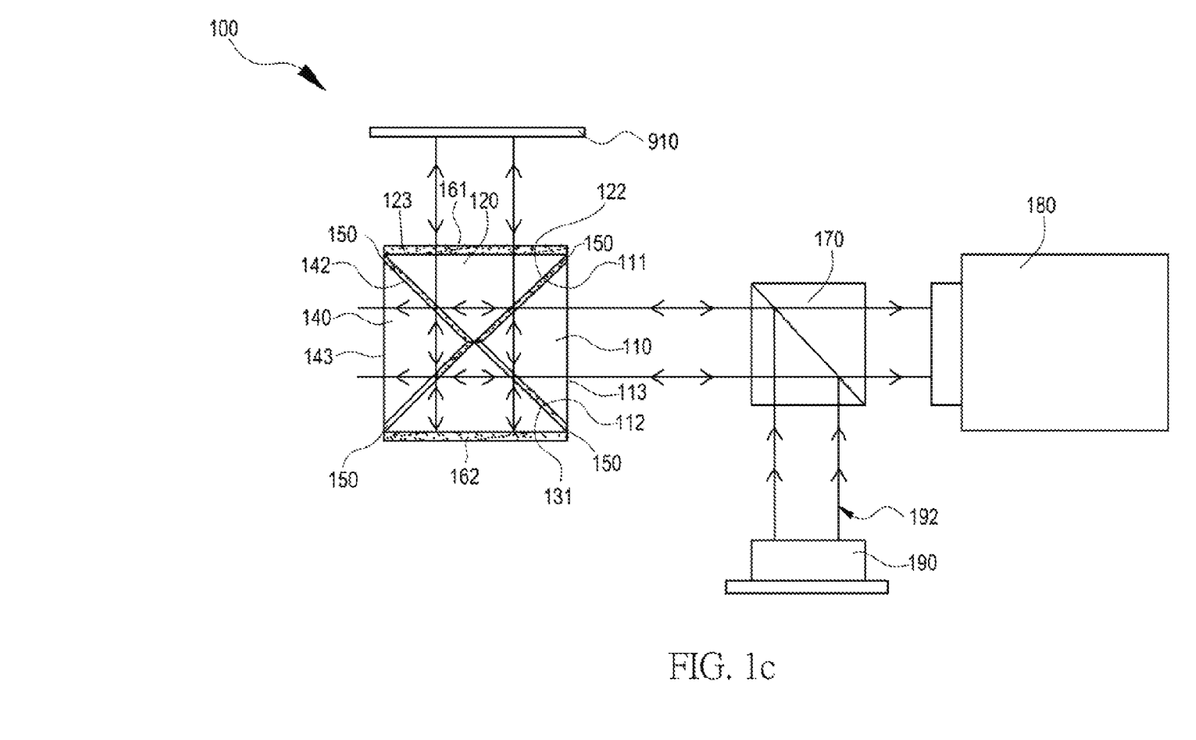
FIG. 1c is a ray path view of light rays at the first wavelength range according to an embodiment of the present invention.

Referring to FIG. 1c, it is assumed that when the light source 190 emits the light rays 192 at the first wavelength range, the light rays 192 at the first wavelength range enter the first prism 110 from the third surface 113 of the first prism 110 after being partially reflected by the beam splitter 170. After the light rays 192 at the first wavelength range enter the first prism 110, and the light rays 192 are partially reflected by the beam splitting coating film group 150 and partially penetrate the beam splitting coating film group 150. One part of the light rays 192 may penetrate the first coating film 161, and the other part of the light rays 192 may penetrate the third surface 143 of the fourth prism 140; in this case, it may be considered as partial penetration and partial reflection of the beam splitting coating film group 150 in a first stage. In the first stage, the beam splitting coating film group 150 permits light rays 192 at the first wavelength range to partially penetrate and reflect, and therefore, one part of light rays 192 may penetrate the first wavelength-selective coating film 161. However, the other part of light rays 192 at the first wavelength range may not penetrate the second wavelength-selective coating film 162.

After light rays 192 at the first wavelength range penetrate the first wavelength-selective coating film 161, light rays 192 at the first wavelength range leaving the first wavelength-selective coating film 161 may irradiate an upper substrate 910 and be reflected, and the reflected light rays 192 at the first wavelength range may enter the second prism 120 from the third surface 123 of the second prism 120; in this case, it may be considered as transmission of the first wavelength-selective coating film 161.

After light rays 192 at the first wavelength range enter the second prism 120, light rays 192 at the first wavelength range is partially reflected by the beam splitting coating film group 150 and partially penetrate the beam splitting coating film group 150. One part of light rays 192 at the first wavelength range may penetrate the third surface 113 of the first prism 110, and the other part of light rays 192 at the first wavelength range may penetrate the third surface 143 of the fourth prism 140; in this case, it may be considered as partial penetration and partial reflection of the beam splitting coating film group 150 in a second stage. In the second stage, the beam splitting coating film group 150 also permits light rays 192 at the first wavelength range to partially penetrate and reflect, and therefore, one part of light rays 192 at the first wavelength range may penetrate the third surface 143 of the fourth prism 140. However, the other part of light rays at the first wavelength range still may not penetrate the second wavelength-selective coating film 162.

After light rays 192 at the first wavelength range partially penetrate and is partially reflected by the beam splitting coating film group 150 in the first stage, penetrate the first wavelength-selective coating film 161, and partially penetrate and is partially reflected by the beam splitting coating film group 150 in the second stage, light rays 192 at the first wavelength range irradiating the upper substrate 910 may penetrate the third surface 113 of the first prism 110 and is imaged on the image capturing apparatus 180 after partially penetrating the beam splitter 170, and therefore, the image capturing apparatus 180 may shoot a pattern on the upper substrate 910.

Figure 1D:
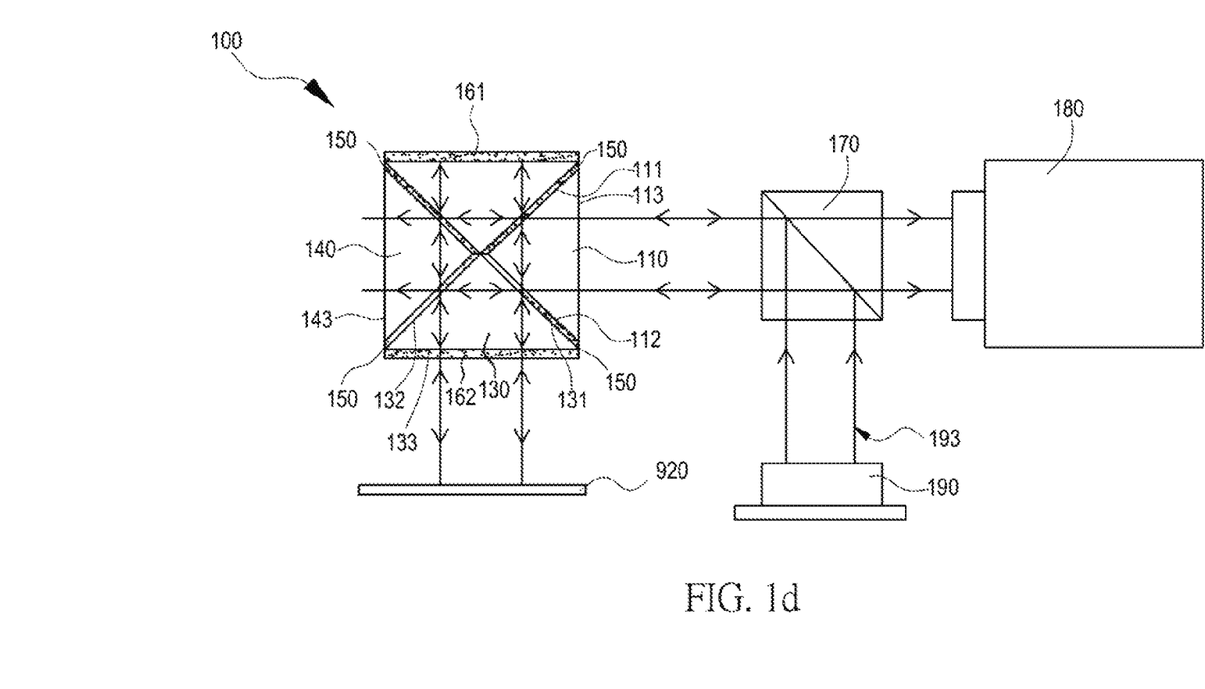
FIG. 1d is a ray path view of light rays at the second wavelength range according to an embodiment of the present invention.

Referring to FIG. 1d, it is assumed that when the light source 190 emits light rays 193 at the second wavelength range, the light rays 193 enter the first prism 110 from the third surface 113 of the first prism 110 after being partially reflected by the beam splitter 170. After light rays 193 at the second wavelength range enters the first prism 110, and light rays 193 at the second wavelength range are partially reflected by and partially penetrate the beam splitting coating film group 150, one part of light rays 193 at the second wavelength range may penetrate the third surface 133 of the third prism 130 and the second wavelength-selective coating film 162, and the other part of light rays 193 at the second wavelength range may penetrate the third surface 143 of the fourth prism 140 and the third surface 113 of the first prism 110; in this case, it may be considered as partial penetration and partial reflection of the beam splitting coating film group 150 in the first stage. In the first stage, the beam splitting coating film group 150 permits light rays 193 at the second wavelength range to partially penetrate and reflect, and therefore, one part of light rays 193 at the second wavelength range may penetrate the second wavelength-selective coating film 162. However, the other part of light rays 193 at the second wavelength range may not penetrate the first wavelength-selective coating film 161.

After light rays 193 at the second wavelength range penetrates the second wavelength-selective coating film 162, light rays 193 at the second wavelength range leaving the second wavelength-selective coating film 162 may irradiate a lower substrate 920 and be reflected, and the reflected light rays 193 at the second wavelength range may enter the third prism 130 from the third surface 133 of the third prism 130; in this case, it may be considered as penetration of the second wavelength-selective coating film 162.

After light rays 193 at the second wavelength range enters the third prism 130, light rays 193 at the second wavelength range are partially reflected by and partially transmit the beam splitting coating film group 150, one part of light rays 193 at the second wavelength range may penetrate the third surface 113 of the first prism 110, and the other part of light rays at the second wavelength range may penetrate the second wavelength-selective coating film 162 and the third surface 143 of the fourth prism 140; in this case, it may be considered as partial penetration and partial reflection of the beam splitting coating film group 150 in the second stage. In the second stage, the beam splitting coating film group 150 also permits light rays 193 at the second wavelength range to partially penetrate and reflect, and therefore, one part of light rays 193 at the second wavelength range may penetrate the third surface 143 of the fourth prism 140. However, the other part of light rays 193 at the second wavelength range still may not penetrate the first wavelength-selective coating film 161.

After light rays 193 at the second wavelength range partially penetrates and are partially reflected by the beam splitting coating film group 150 in the first stage, penetrates the second wavelength-selective coating film 162, and partially penetrates and is partially reflected by the beam splitting coating film group 150 in the second stage, the light rays 193 at the second wavelength range irradiating the lower substrate 920 may penetrate the third surface 113 of the first prism 110 and is imaged on the image capturing apparatus 180 after partially penetrating the beam splitter 170. Therefore, the image capturing apparatus 180 may shoot a pattern on the lower substrate 920.

Referring to FIG. 1c and FIG. 1d together again, if the light source 190 emits white light, the white light is divided into light rays 192 at the first wavelength range and light rays 193 at the second wavelength range because of design of the first wavelength-selective coating film 161 and the second wavelength-selective coating film 162. Light rays 192 at the first wavelength range move in a path in which the light rays at the first wavelength range shown in FIG. 1c partially penetrates and are partially reflected by the beam splitting coating film group 150 in the first stage, penetrates the first wavelength-selective coating film 161, and partially penetrates and are partially reflected by the beam splitting coating film group 150 in the second stage, and is imaged on the image capturing apparatus 180. Light rays 193 at the second wavelength range move in a path in which the light rays at the second wavelength range shown in FIG. 1d partially penetrates and are partially reflected by the beam splitting coating film group 150 in the first stage, penetrates the second wavelength-selective coating film 162, and partially penetrates and are partially reflected by the beam splitting coating film group 150 in the second stage, and is imaged on the image capturing apparatus 180. The light ray irradiating the upper substrate 910 and the lower substrate 920 may simultaneously be imaged on the image capturing apparatus 180, and therefore, the image capturing apparatus 180 may simultaneously observe patterns on the upper substrate 910 and the lower substrate 920.

Figure 2:
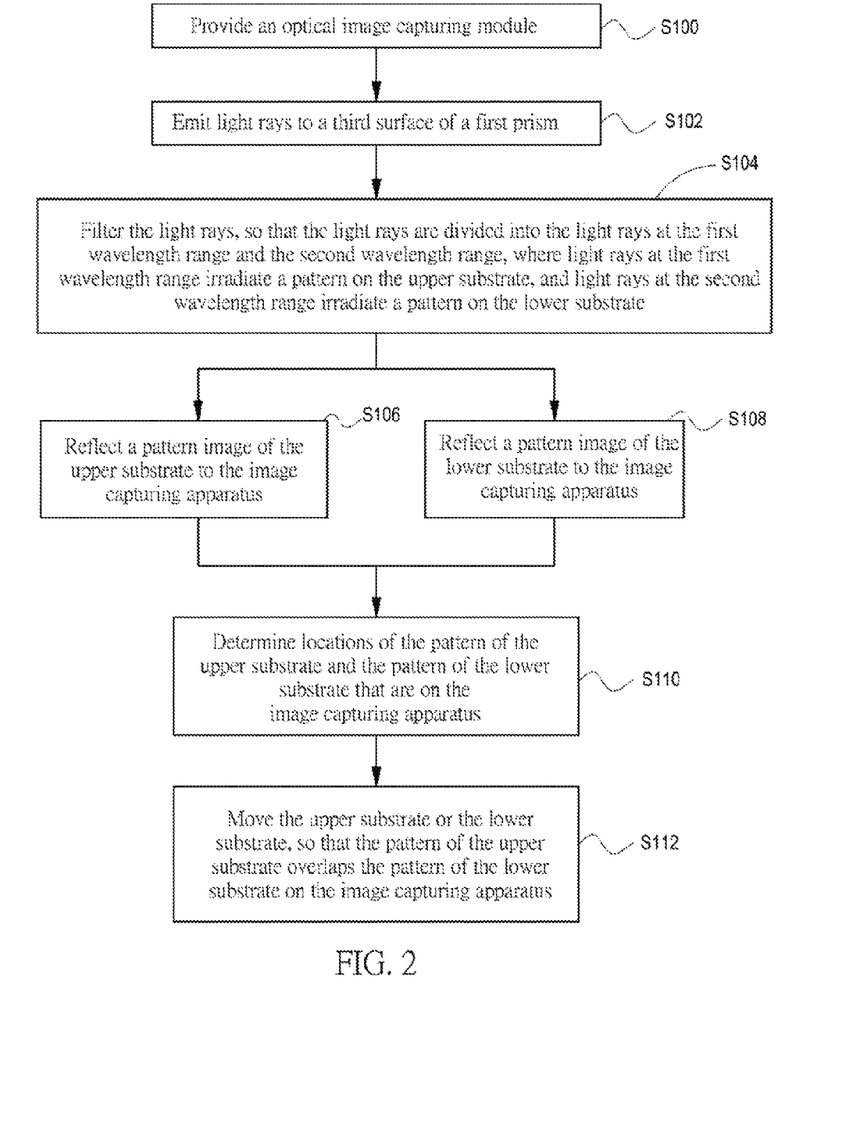
FIG. 2 is a flow chart of an aligning method according to an embodiment of the present invention.
Figure 3A:
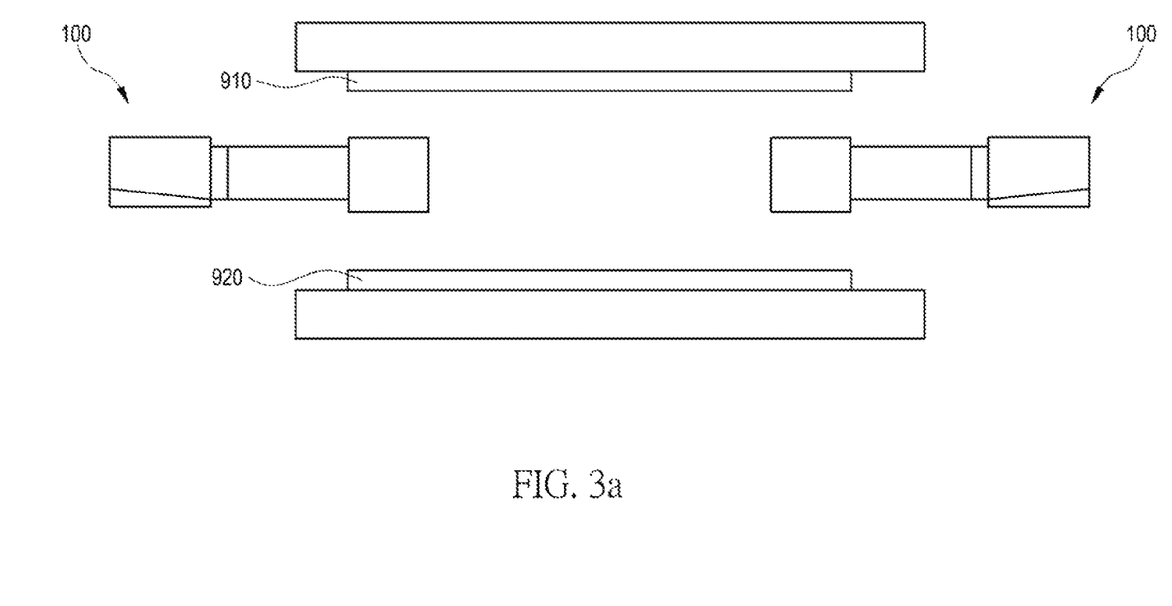
FIG. 3a is a schematic cross-sectional view of an upper substrate, a lower substrate, and an optical image capturing module.
Figure 3B:
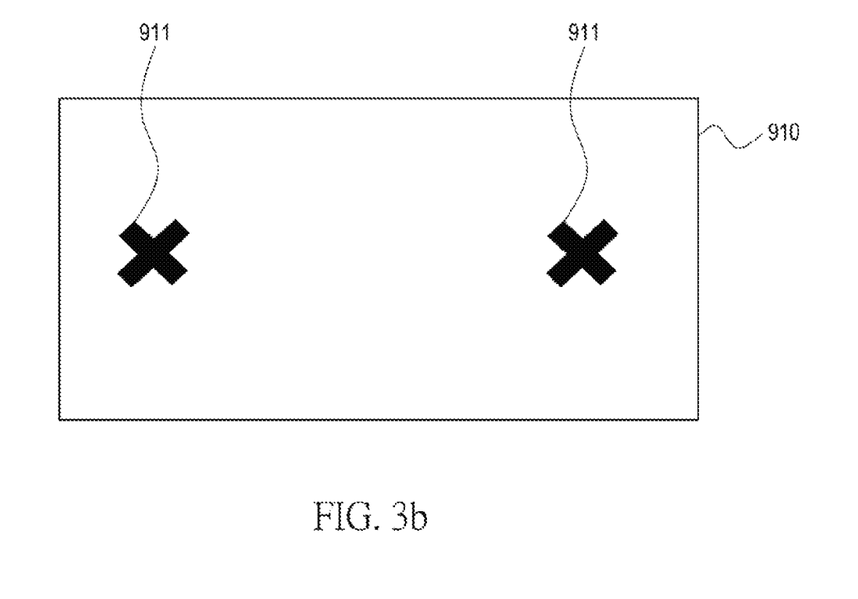
FIG. 3b is a plane view of an upper substrate.
Figure 3C:
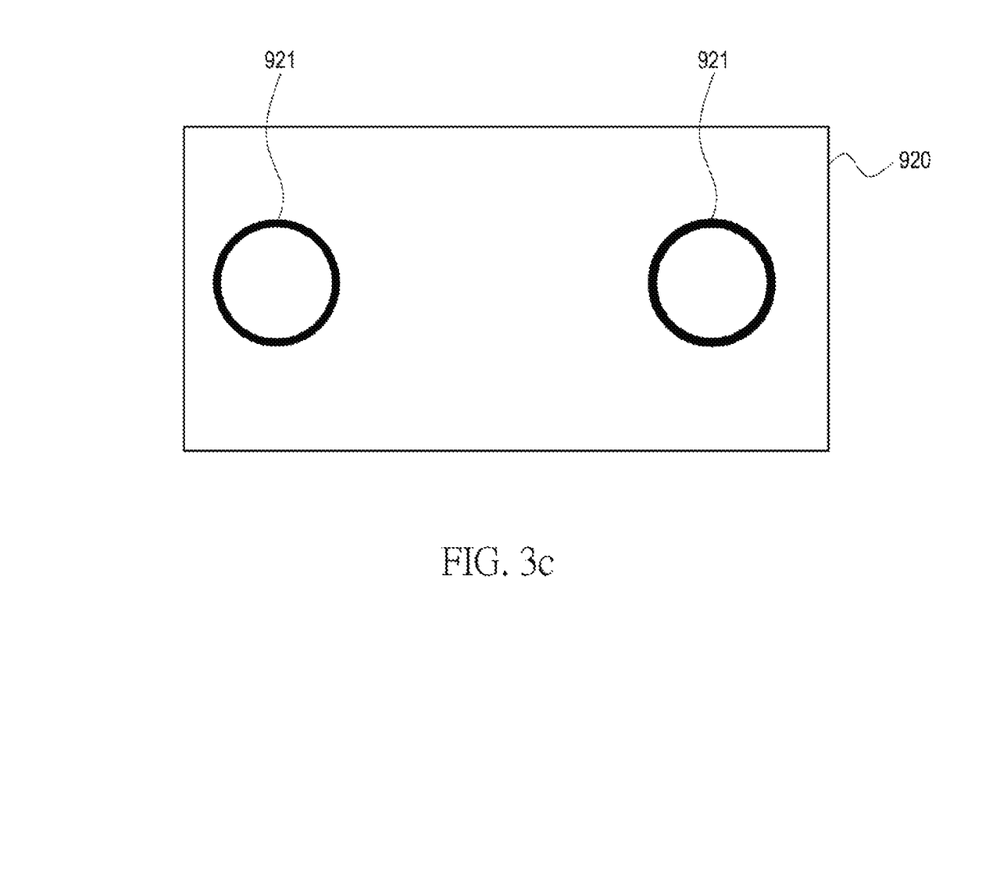
FIG. 3c is a plane view of a lower substrate.
Figure 3D:
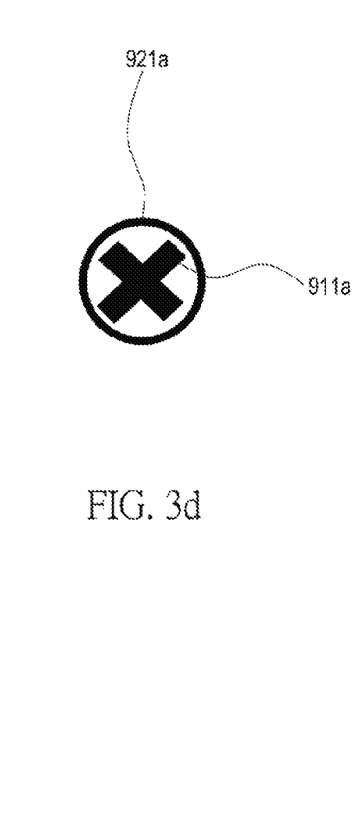
FIG. 3d is a schematic view in which a pattern of an upper substrate overlaps a pattern of a lower substrate.

FIG. 2 is a flow chart of an aligning method according to an embodiment of the present invention. The aligning method is mainly applied to aligning between an upper substrate and a lower substrate. FIG. 3a is a schematic cross-sectional view of an upper substrate, a lower substrate, and an optical image capturing module, in which their relative locations are shown. The upper substrate 910 and the lower substrate 920 are oppositely arranged, and two groups of optical image capturing modules 100 are arranged between the upper substrate 910 and the lower substrate 920. The aligning method mainly uses the optical image capturing module 100 in the embodiment of the present invention, and the optical image capturing module 100 is arranged between the upper substrate 910 and the lower substrate 920. FIG. 3b is a plane view of an upper substrate, and in the diagram, two X-shape patterns 911 are shown on the surface of the upper substrate 910. FIG. 3c is a plane diagram of a lower substrate, and in the diagram, two O-shape patterns 921 are shown on the surface of the lower substrate 920. FIG. 3d is a schematic diagram in which a pattern of an upper substrate overlaps a pattern of a lower substrate. Refer to FIG. 1c, FIG. 1d, FIG. 2, and FIG. 3a to FIG. 3d together.

Step S100: Provide an optical image capturing module arranged between an upper substrate and a lower substrate. In this step, the optical image capturing module may be the optical image capturing module 100 shown in FIG. 1a.

Step S102: Emit light rays to a third surface of a first prism. In this step, a light source 190 emits light rays, and the light rays are partially reflected by a beam splitter 170, so that the light rays enter a third surface 113 of a first prism 110. The light rays may be a white light or a light simultaneously having light rays 192 at the first wavelength range and light rays 193 at the second wavelength range. In this embodiment, the light rays are a light simultaneously having light rays 192 at the first wavelength range and light rays 193 at the second wavelength range.

Step S104: Filter the light rays, so that the light rays are divided into the light rays at the first wavelength range and the second wavelength range, where light rays at the first wavelength range irradiate a pattern on the upper substrate, and light rays at the second wavelength range irradiate a pattern on the lower substrate. In this step, after the light rays enter the first prism, light rays 192 at the first wavelength range shown in FIG. 1c partially penetrates and are partially reflected by the beam splitting coating film group 150 in a first stage, and penetrates the first wavelength-selective coating film 161, to irradiate an X-shape pattern 911 (shown in FIG. 3b) on the upper substrate 910. After light rays 193 at the second wavelength range shown in FIG. 1d partially penetrates and is partially reflected by the beam splitting coating film group 150 in the first stage, and penetrates the second wavelength-selective coating film 162, the light rays

193 at the second wavelength range irradiate an O-shape pattern 921 (shown in FIG. 3c) on the lower substrate 920. It can be understood that, when white light is adopted as the light source, an implementation manner in which the white light is divided into light rays 192 at the first wavelength range and light rays 193 at the second wavelength range has already been described in the foregoing, which is not described herein again.

Step S106: Reflect a pattern image of the upper substrate to the image capturing apparatus. In this step, light rays 192 at the first wavelength range irradiate the X-shape pattern 911 on the upper substrate 910 and are then reflected. After the reflected light rays at the first wavelength range, as shown in FIG. 1c, penetrates the first wavelength-selective coating film 161, and partially penetrates and is partially reflected by the beam splitting coating film group 150 in the second stage, the reflected light rays 192 at the first wavelength range irradiate the image capturing apparatus 180. Therefore, the X-shape pattern 911 of the upper substrate 910 may be imaged as a pattern image being a first pattern 911a (which is also an X-shape pattern, as shown in FIG. 3d) on the image capturing apparatus 180.

Step S108: Reflect a pattern image of the lower substrate to the image capturing apparatus. In this step, light rays 193 at the second wavelength range irradiate the O-shape pattern 921 on the lower substrate 920 and are then reflected. After the reflected light rays 193 at the second wavelength range, as shown in FIG. 1d, penetrates the second wavelength-selective coating film 162, partially penetrates and is partially reflected by the beam splitting coating film group 150 in the second stage, the reflected light rays 193 at the second wavelength range irradiate the image capturing apparatus 180. Therefore, the O-shape pattern 921 of the lower substrate 920 may be imaged as a pattern image being a second pattern 921a (which is also an O-shape pattern, as shown in FIG. 3d) on the image capturing apparatus 180.

Step S106 and step S108 are performed simultaneously, and therefore, the X-shape pattern 911 of the upper substrate 910 and the O-shape pattern 921 of the lower substrate 920 may be simultaneously imaged as the first pattern 911a and the second pattern 921a on the image capturing apparatus 180.

Step S110: Determine locations of the pattern of the upper substrate and the pattern of the lower substrate that are on the image capturing apparatus. In this step, because the X-shape pattern 911 on the upper substrate 910 and the O-shape pattern 921 of the lower substrate 920 are simultaneously imaged on the image capturing apparatus 180, the locations of the pattern of the upper substrate 910 and the pattern of the lower substrate 920 on the image capturing apparatus may be known in an image determining manner.

Step S112: Move the upper substrate or the lower substrate, so that the pattern of the upper substrate overlaps the pattern of the lower substrate on the image capturing apparatus. In this step, the upper substrate 910 or the lower substrate 920 is horizontally moved, and when the first pattern 911a overlaps the second pattern 921a on the image capturing apparatus 180 (as shown in FIG. 3d), it can be determined that an aligning action is already completed for the upper substrate 910 and the lower substrate 920.

Figure 4:
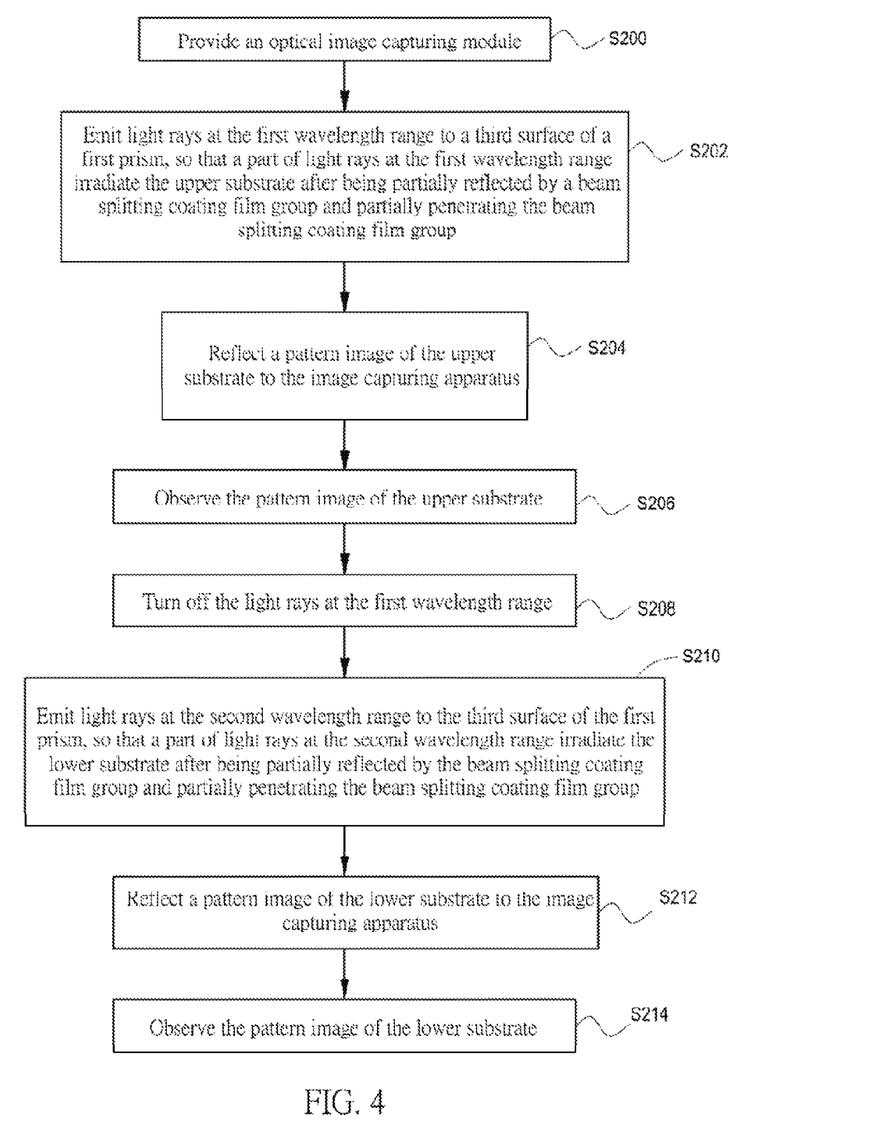
FIG. 4 is a flow chart of an observing method according to an embodiment of the present invention.

FIG. 4 is a flow chart of an observing method according to an embodiment of the present invention. The observing method may be used to observe a surface of an upper substrate 910 or a lower substrate 920. The observing method mainly uses an optical image capturing module 100 in the embodiment of the present invention, and the optical image capturing module 100 is arranged between the upper substrate 910 and the lower substrate 920 (as shown in FIG. 3a). Refer to FIG. 1c, FIG. 1d, FIG. 3a to FIG. 3d, and FIG. 4 together.

Step S200: Provide an optical image capturing module. In this step, the optical image capturing module may be the optical image capturing module 100 shown in FIG. 1a.

Step S202: Emit light rays at the first wavelength range to a third surface of a first prism, so that a part of light rays at the first wavelength range irradiate the upper substrate after being partially reflected by a beam splitting coating film group and partially penetrating the beam splitting coating film group. In this step, a light source 190 emits light rays 192 at the first wavelength range, and after being partially reflected by a beam splitter 170, the light rays 192 at the first wavelength range enter the third surface 113 of the first prism 110. Then, after light rays 192 at the first wavelength range shown in FIG. 1c partially penetrates and is partially reflected by the beam splitting coating film group 150 in a first stage, and penetrates a first wavelength-selective coating film 161, light rays at the first wavelength range irradiate the X-shape pattern 911 (shown in FIG. 3b) on the upper substrate 910.

Step S204: Reflect a pattern image of the upper substrate to the image capturing apparatus. In this step, light rays 192 at the first wavelength range irradiates the X-shape pattern 911 on the upper substrate 910 and are then reflected, and as shown in FIG. 1c, after the reflected light rays at the first wavelength range penetrates the first wavelength-selective coating film 161 and partially penetrates and is partially reflected by the beam splitting coating film group 150 in a second stage, the reflected light rays 192 at the first wavelength range irradiates the image capturing apparatus 180. Therefore, the X-shape pattern 911 on the upper substrate 910 may be imaged as a pattern image being on the image capturing apparatus 180.

Step S206: Observe the pattern image of the upper substrate. In this step, the image capturing apparatus 180 observes the X-shape pattern 911 on the upper substrate 910.

Step S208: Turn off the light rays at the first wavelength range. In this step, the light source 190 is controlled, so that the light source 190 does not emit the light rays 192 at the first wavelength range.

Step S210: Emit light rays at the second wavelength range to the third surface of the first prism, so that a part of light rays at the second wavelength range irradiate the lower substrate after being partially reflected by the beam splitting coating film group and partially penetrating the beam splitting coating film group. In this step, the light source 190 emits light rays 193 at the second wavelength range, and after being partially reflected by a beam splitter 170, light rays 193 at the second wavelength range enter the third surface 113 of the first prism 110. Then, after light rays 193 at the second wavelength range shown in FIG. 1d partially penetrates and is partially reflected by the beam splitting coating film group 150 in the first stage, and penetrates a second wavelength-selective coating film 162, light rays 193 at the second wavelength range irradiates the O-shape pattern 921 (shown in FIG. 3c) on the lower substrate 920.

Step S212: Reflect a pattern image of the lower substrate to the image capturing apparatus. In this step, light rays 193 at the second wavelength range irradiate the O-shape pattern 921 on the lower substrate 920 and are then reflected. After the reflected light rays at the second wavelength range, as shown in FIG. 1d, penetrates the second wavelength-selective coating film 162, and partially penetrates and is partially reflected by the beam splitting coating film group 150 in the second stage, the reflected light rays at the second wavelength range irradiate the image capturing apparatus 180. Therefore, the O-shape pattern 921 on the lower substrate 920 may be imaged as a pattern image being on the image capturing apparatus 180.

Step S214: Observe the pattern image of the lower substrate. In this step, the image capturing apparatus 180 observes the O-shape pattern 921 on the lower substrate 920.

To sum up, the present invention has the following features that: the present invention can provide a symmetrical light path length, which is beneficial for reducing the size of image capturing module, a symmetrical optical working distance can be reached, and contrast performance of images at two sides can be the same. Compared with a composite right-angled prism in the prior art which may cause inequality of reflection path length of light rays of an upper to-be-detected object and a lower to-be-detected object, if image capturing is considered in the present invention, inequality of the optical working distances may not be caused, and therefore, the upper to-be-detected object and the lower to-be-detected object (an upper substrate and a lower substrates) of the present invention do not need to be placed at asymmetrical distances.

The present invention can provide a development method in which a light path using a coaxial light source irradiates a to-be-detected object, which has better space usage flexibility and application compared with a development method in the prior art in which a composite right-angled prism can only use an external light source to irradiate a to-be-detected object.

The present invention can provide a mechanism for quickly switching ray paths which does not need any entity shutter element, and is shorter in time, and simpler in control manner compared with a traditional mechanical or electronic liquid crystal shutter.

The present invention may provide a method in which when upper and lower substrates are aligned, aligning precision can be effectively improved, and an error caused by assembling optical and mechanical elements is reduced.

The present invention can be applied to industries requiring precise aligning and locating, such as a touch panel and IC electronic bonding, provide an image display manner with high stability, lower an error of mechanical motion control, solve the coordinate algorithm problem, and improve industrial process technologies, the production speed, and the product yield.

To sum up, the present invention only records the implementation manners or embodiments of the technical means used to solve the problems, and are not intended to limit the scope of implementation of the patent of the present invention. Any equivalent change and modification which conform to the application scope of the patent of the present invention and are made according to the scope of the patent of the present invention are covered by the scope of the patent of the present invention.

What is claimed is:

1. An optical image capturing module, comprising:
a first prism, having a first surface, a second surface, and a third surface, wherein section lengths of the first surface and the second surface of the first prism are equal;
a second prism, having a first surface, a second surface, and a third surface, wherein section lengths of the first surface and the second surface of the second prism are equal, and the second surface of the second prism is adjacent to the first surface of the first prism;
a third prism, having a first surface, a second surface, and a third surface, wherein section lengths of the first surface and the second surface of the third prism are equal, and the first surface of the third prism is adjacent to the second surface of the first prism;
a fourth prism, having a first surface and a second surface of which section lengths are equal, wherein the first surface of the fourth prism is adjacent to the second surface of the third prism, and the second surface of the fourth prism is adjacent to the first surface of the second prism;
a first wavelength-selective medium, arranged on the third surface of the second prism, wherein the first wavelength-selective medium permits light rays at a first wavelength range greater than a cut-off wavelength to penetrate, and light rays at a second wavelength range less than the cut-off wavelength to reflect;
a second wavelength-selective medium, arranged on the third surface of the third prism, wherein the second wavelength-selective medium permits light rays at the second wavelength range less than the cut-off wavelength to penetrate, and light rays at the first wavelength range greater than the cut-off wavelength to reflect;
a beam splitting coating film group, having a plurality of coating films, separately arranged between the first surface of the first prism and the second surface of the second prism, between the first surface of the second prism and the second surface of the fourth prism, between the first surface of the fourth prism and the second surface of the third prism, and between the first surface of the third prism and the second surface of the third prism;
a light source, emitting light rays to the third surface of the first prism; and
an image capturer, oppositely arranged with the third surface of the first prism.

2. The optical image capturing module according to claim 1, further comprising:
a beam splitter, arranged between the first prism and the image capturer, and adjacent to the third surface of the first prism,
wherein, a direction in which the light rays of the light source enter the beam splitter is vertical to an image receiving direction of the image capturer.

3. The optical image capturing module according to claim 1, wherein the light source emits light rays at the first wavelength range and at the second wavelength range.

4. The optical image capturing module according to claim 1, wherein the light source emits white light.

5. The optical image capturing module according to claim 1, wherein the light rays at the first wavelength range have a single wavelength being greater than the cut-off wavelength, and the light rays at the second wavelength range have a single wavelength being less than the cut-off wavelength.

6. The optical image capturing module according to claim 1, wherein light rays at the first wavelength range have first wavelengths greater than the cut-off wavelength, the light rays at the second wavelength range have second wavelengths less than the cut-off wavelength, and light rays at the first wavelength range and at the second wavelength range are light rays that have a range of continuous wavelengths.

7. The optical image capturing module according to claim 1, wherein the cut-off wavelength is an intersection of a transmittance curve of the first wavelength-selective medium and a transmittance curve of the second wavelength-selective medium.

8. The optical image capturing module according to claim 5, wherein the cut-off wavelength is an intersection of a transmittance curve of the first wavelength-selective medium and a transmittance curve of the second wavelength-selective medium.

9. The optical image capturing module according to claim 6, wherein the cut-off wavelength is an intersection of a transmittance curve of the first wavelength-selective medium and a transmittance curve of the second wavelength-selective medium.

10. The optical image capturing module according to claim 1, wherein the first wavelength-selective medium is a coating film or a filter, and the second wavelength-selective medium is a coating film or a filter.

11. A method of aligning an upper substrate and a lower substrate, the upper substrate and the lower substrate oppositely arranged, the method comprising the following steps of:
providing an optical image capturing module, arranged between the upper substrate and the lower substrate, wherein the optical image capturing module comprises:
a first prism, having a first surface, a second surface, and a third surface, wherein section lengths of the first surface and the second surface of the first prism are equal;
a second prism, having a first surface, a second surface, and a third surface, wherein section lengths of the first surface and the second surface of the second prism are equal, and the second surface of the second prism is adjacent to the first surface of the first prism;
a third prism, having a first surface, a second surface, and a third surface, wherein section lengths of the first surface and the second surface of the third prism are equal, and the first surface of the third prism is adjacent to the second surface of the first prism;
a fourth prism, having a first surface and a second surface of which section lengths are equal, wherein the first surface of the fourth prism is adjacent to the second surface of the third prism, and the second surface of the fourth prism is adjacent to the first surface of the second prism;
a first wavelength-selective medium, arranged on the third surface of the second prism, wherein the first wavelength-selective medium permits light rays at a first wavelength range greater than a cut-off wavelength to penetrate, and light rays at a second wavelength range less than the cut-off wavelength to reflect;
a second wavelength-selective medium, arranged on the third surface of the third prism, wherein the second wavelength-selective medium permits light rays at the second wavelength range less than the cut-off wavelength to penetrate, and light rays at the first wavelength range greater than the cut-off wavelength to reflect;
a beam splitting coating film group, having a plurality of coating films, separately arranged between the first surface of the first prism and the second surface of the second prism, between the first surface of the second prism and the second surface of the fourth prism, between the first surface of the fourth prism and the second surface of the third prism, and between the first surface of the third prism and the second surface of the third prism;
a light source, emitting light rays to the third surface of the first prism; and
an image capturer, oppositely arranged with the third surface of the first prism
emitting, by the light source, light rays to the third surface of the first prism; and
irradiating, by light rays at the first wavelength range after leaving the optical image capturing module from the first wavelength-selective medium, a pattern of the upper substrate, and irradiating, by light rays at the second wavelength range after leaving the optical image capturing module from the second wavelength-selective medium, a pattern of the lower substrate;
reflecting a pattern image of the upper substrate to image a first pattern on the image capturer, and reflecting a pattern image of the lower substrate to image a second pattern on the image capturer;
determining locations of the first pattern and the second pattern; and
moving the upper substrate or the lower substrate, so that the first pattern overlaps the second pattern.

12. The method according to claim 11, further comprising the following step of: moving the upper substrate and/or the lower substrate, so that the first pattern overlaps the second pattern on the image capturer.

13. A method of observing a pattern on an upper substrate or a pattern on a lower substrate, the upper substrate and the lower substrate oppositely arranged, the method comprising the following steps of:
providing an optical image capturing module, comprising:
a first prism, having a first surface, a second surface, and a third surface, wherein section lengths of the first surface and the second surface of the first prism are equal;
a second prism, having a first surface, a second surface, and a third surface, wherein section lengths of the first surface and the second surface of the second prism are equal, and the second surface of the second prism is adjacent to the first surface of the first prism;
a third prism, having a first surface, a second surface, and a third surface, wherein section lengths of the first surface and the second surface of the third prism are equal, and the first surface of the third prism is adjacent to the second surface of the first prism;
a fourth prism, having a first surface and a second surface of which section lengths are equal, wherein the first surface of the fourth prism is adjacent to the second surface of the third prism, and the second surface of the fourth prism is adjacent to the first surface of the second prism;
a first wavelength-selective medium, arranged on the third surface of the second prism, wherein the first wavelength-selective medium permits light rays at a first wavelength range greater than a cut-off wavelength to penetrate, and light rays at a second wavelength range less than the cut-off wavelength to reflect;
a second wavelength-selective medium, arranged on the third surface of the third prism, wherein the second wavelength-selective medium permits light rays at the second wavelength range less than the cut-off wavelength to penetrate, and light rays at the first wavelength range greater than the cut-off wavelength to reflect;
a beam splitting coating film group, having a plurality of coating films, separately arranged between the first surface of the first prism and the second surface of the second prism, between the first surface of the second prism and the second surface of the fourth prism, between the first surface of the fourth prism and the second surface of the third prism, and between the first surface of the third prism and the second surface of the third prism;
a light source, emitting light rays to the third surface of the first prism; and
an image capturer, oppositely arranged with the third surface of the first prism emitting light rays at the first wavelength range to the third surface of the first prism, so that a part of light rays at the first wavelength range irradiate the upper substrate after being partially reflected by the beam splitting coating film group and partially penetrating the beam splitting coating film group;

reflecting a pattern image of the upper substrate to the image capturer;

observing the pattern image of the upper substrate;

turning off the light rays at the first wavelength range;

emitting light rays at the second wavelength range to the third surface of the first prism, so that a part of light rays at the second wavelength range irradiate the lower substrate after being partially reflected by the beam splitting coating film group and partially transmitting the beam splitting coating film group;

reflecting a pattern image of the lower substrate to the image capturer; and observing the pattern image of the lower substrate.

14. The method according to claim 13, wherein the light rays at the first wavelength range have first wavelengths being greater than the cut-off wavelength, and the light rays at the second wavelength range have second wavelengths being less than the cut-off wavelength.

* * * * *